(12) United States Patent
Lindert et al.

(10) Patent No.: US 7,781,771 B2
(45) Date of Patent: Aug. 24, 2010

(54) BULK NON-PLANAR TRANSISTOR HAVING STRAINED ENHANCED MOBILITY AND METHODS OF FABRICATION

(75) Inventors: Nick Lindert, Beaverton, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/025,665

(22) Filed: Feb. 4, 2008

(65) Prior Publication Data

US 2008/0142841 A1   Jun. 19, 2008

Related U.S. Application Data

(60) Continuation of application No. 11/088,035, filed on Mar. 22, 2005, now Pat. No. 7,326,634, which is a division of application No. 10/816,311, filed on Mar. 31, 2004, now Pat. No. 7,154,118.

(51) Int. Cl.
*H01L 29/06* (2006.01)
*H01L 29/10* (2006.01)

(52) U.S. Cl. .............. 257/66; 257/17; 257/18; 257/19; 257/65; 257/202; 257/250

(58) Field of Classification Search .......... 257/202, 257/250, 66, 65, 19, 77, 18
See application file for complete search history.

(56) References Cited

U.S. PATENT DOCUMENTS 4,231,149 A   11/1980   Chapman et al.
4,487,652 A   12/1984   Almgren (Continued)

FOREIGN PATENT DOCUMENTS

DE   10203998   8/2003

(Continued)

OTHER PUBLICATIONS

Office Action from U.S. Appl. No. 11/080,765 mailed May 2, 2007, 21 pgs.

(Continued)

*Primary Examiner*—Kenneth A Parker
*Assistant Examiner*—Joseph Nguyen
(74) *Attorney, Agent, or Firm*—Blakely, Sokoloff, Taylor & Zafman LLP

(57) ABSTRACT

A method of a bulk tri-gate transistor having stained enhanced mobility and its method of fabrication. The present invention is a nonplanar transistor having a strained enhanced mobility and its method of fabrication. The transistor has a semiconductor body formed on a semiconductor substrate wherein the semiconductor body has a top surface on laterally opposite sidewalls. A semiconductor capping layer is formed on the top surface and on the sidewalls of the semiconductor body. A gate dielectric layer is formed on the semiconductor capping layer on the top surface of a semiconductor body and is formed on the capping layer on the sidewalls of the semiconductor body. A gate electrode having a pair of laterally opposite sidewalls is formed on and around the gate dielectric layer. A pair of source/drain regions are formed in the semiconductor body on opposite sides of the gate electrode.

13 Claims, 8 Drawing Sheets

U.S. PATENT DOCUMENTS

| | | |
|---|---|---|
| 4,711,701 A | 12/1987 | McLevige |
| 4,818,715 A | 4/1989 | Chao |
| 4,905,063 A | 2/1990 | Beltram et al. |
| 4,906,589 A | 3/1990 | Chao |
| 4,907,048 A | 3/1990 | Huang |
| 4,994,873 A | 2/1991 | Madan |
| 4,996,574 A | 2/1991 | Shirasaka et al. |
| 5,023,203 A | 6/1991 | Choi |
| 5,120,666 A | 6/1992 | Gotou |
| 5,124,777 A | 6/1992 | Lee |
| 5,179,037 A | 1/1993 | Seabaugh |
| 5,216,271 A | 6/1993 | Takagi et al. |
| 5,278,102 A | 1/1994 | Horie |
| 5,308,999 A | 5/1994 | Gotou |
| 5,328,810 A | 7/1994 | Lowrey et al. |
| 5,338,959 A | 8/1994 | Kim et al. |
| 5,346,836 A | 9/1994 | Manning et al. |
| 5,346,839 A | 9/1994 | Sundaresan |
| 5,357,119 A | 10/1994 | Wang et al. |
| 5,391,506 A | 2/1995 | Tada et al. |
| 5,466,621 A | 11/1995 | Hisamoto et al. |
| 5,475,869 A | 12/1995 | Gomi et al. |
| 5,479,033 A | 12/1995 | Baca et al. |
| 5,482,877 A | 1/1996 | Rhee |
| 5,514,885 A | 5/1996 | Myrick |
| 5,521,859 A | 5/1996 | Ema et al. |
| 5,543,351 A | 8/1996 | Hirai et al. |
| 5,545,586 A | 8/1996 | Koh |
| 5,563,077 A | 10/1996 | Ha |
| 5,576,227 A | 11/1996 | Hsu |
| 5,578,513 A | 11/1996 | Maegawa |
| 5,595,919 A | 1/1997 | Pan |
| 5,652,454 A | 7/1997 | Iwamatsu et al. |
| 5,658,806 A | 8/1997 | Lin et al. |
| 5,665,203 A | 9/1997 | Lee et al. |
| 5,682,048 A | 10/1997 | Shinohara et al. |
| 5,698,869 A | 12/1997 | Yoshimi et al. |
| 5,701,016 A | 12/1997 | Burroughes et al. |
| 5,716,879 A | 2/1998 | Choi et al. |
| 5,739,544 A | 4/1998 | Yuki et al. |
| 5,760,442 A | 6/1998 | Shigyo et al. |
| 5,770,513 A | 6/1998 | Okaniwa et al. |
| 5,773,331 A | 6/1998 | Solomon et al. |
| 5,776,821 A | 7/1998 | Haskell et al. |
| 5,793,088 A | 8/1998 | Choi et al. |
| 5,804,848 A | 9/1998 | Mukai |
| 5,811,324 A | 9/1998 | Yang |
| 5,814,895 A | 9/1998 | Hirayama et al. |
| 5,821,629 A | 10/1998 | Wen et al. |
| 5,827,769 A | 10/1998 | Aminzadeh et al. |
| 5,844,278 A | 12/1998 | Mizuno et al. |
| 5,856,225 A | 1/1999 | Lee et al. |
| 5,880,015 A | 3/1999 | Hata |
| 5,888,309 A | 3/1999 | Yu |
| 5,889,304 A | 3/1999 | Watanabe et al. |
| 5,899,710 A | 5/1999 | Mukai |
| 5,905,285 A | 5/1999 | Garnder et al. |
| 5,908,313 A | 6/1999 | Chau et al. |
| 5,952,701 A | 9/1999 | Bulucea et al. |
| 5,965,914 A | 10/1999 | Miyamoto |
| 5,976,767 A | 11/1999 | Li |
| 5,985,726 A | 11/1999 | Yu et al. |
| 6,013,926 A | 1/2000 | Oku et al. |
| 6,018,176 A | 1/2000 | Lim |
| 6,031,249 A | 2/2000 | Yamazaki et al. |
| 6,051,452 A | 4/2000 | Shigyo et al. |
| 6,054,355 A | 4/2000 | Inumiya et al. |
| 6,063,675 A | 5/2000 | Rodder |
| 6,066,869 A | 5/2000 | Noble et al. |
| 6,087,208 A | 7/2000 | Krivokapic et al. |
| 6,093,621 A | 7/2000 | Tseng |
| 6,114,201 A | 9/2000 | Wu |
| 6,114,206 A | 9/2000 | Yu |
| 6,117,741 A | 9/2000 | Chatterjee et al. |
| 6,120,846 A | 9/2000 | Hintermaier et al. |
| 6,144,072 A | 11/2000 | Iwamatsu et al. |
| 6,150,222 A | 11/2000 | Gardner et al. |
| 6,153,485 A | 11/2000 | Pey et al. |
| 6,163,053 A | 12/2000 | Kawashima |
| 6,165,880 A | 12/2000 | Yaung et al. |
| 6,174,820 B1 | 1/2001 | Habermehl et al. |
| 6,190,975 B1 | 2/2001 | Kubo et al. |
| 6,200,865 B1 | 3/2001 | Gardner et al. |
| 6,218,309 B1 | 4/2001 | Miller et al. |
| 6,251,729 B1 | 6/2001 | Montree et al. |
| 6,251,763 B1 | 6/2001 | Inumiya et al. |
| 6,252,284 B1 | 6/2001 | Muller et al. |
| 6,259,135 B1 | 7/2001 | Hsu et al. |
| 6,261,921 B1 | 7/2001 | Yen et al. |
| 6,262,456 B1 | 7/2001 | Yu et al. |
| 6,274,503 B1 | 8/2001 | Hsieh |
| 6,287,924 B1 | 9/2001 | Chao et al. |
| 6,294,416 B1 | 9/2001 | Wu |
| 6,307,235 B1 | 10/2001 | Forbes et al. |
| 6,310,367 B1 | 10/2001 | Yagishita et al. |
| 6,319,807 B1 | 11/2001 | Yeh et al. |
| 6,335,251 B2 | 1/2002 | Miyano et al. |
| 6,358,800 B1 | 3/2002 | Tseng |
| 6,359,311 B1 | 3/2002 | Colinge et al. |
| 6,362,111 B1 | 3/2002 | Laaksonen et al. |
| 6,368,923 B1 | 4/2002 | Huang |
| 6,376,317 B1 | 4/2002 | Forbes et al. |
| 6,383,882 B1 | 5/2002 | Lee et al. |
| 6,387,820 B1 | 5/2002 | Sanderfer |
| 6,391,782 B1 | 5/2002 | Yu |
| 6,396,108 B1 | 5/2002 | Krivokapic et al. |
| 6,399,970 B2 | 6/2002 | Kubo et al. |
| 6,403,434 B1 | 6/2002 | Yu |
| 6,403,981 B1 | 6/2002 | Yu |
| 6,407,442 B2 | 6/2002 | Inoue et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,457,890 B1 | 10/2002 | Kohlruss et al. |
| 6,458,662 B1 | 10/2002 | Yu |
| 6,459,123 B1 | 10/2002 | Enders et al. |
| 6,465,290 B1 | 10/2002 | Suguro et al. |
| 6,472,258 B1 | 10/2002 | Adkisson et al. |
| 6,475,869 B1 | 11/2002 | Yu |
| 6,475,890 B1 | 11/2002 | Yu |
| 6,479,866 B1 | 11/2002 | Xiang |
| 6,483,146 B2 | 11/2002 | Lee et al. |
| 6,483,151 B2 | 11/2002 | Wakabayashi et al. |
| 6,483,156 B1 | 11/2002 | Adkisson et al. |
| 6,495,403 B1 | 12/2002 | Skotnicki |
| 6,498,096 B2 | 12/2002 | Bruce et al. |
| 6,500,767 B2 | 12/2002 | Chiou et al. |
| 6,501,141 B1 | 12/2002 | Leu |
| 6,506,692 B2 | 1/2003 | Andideh |
| 6,525,403 B2 | 2/2003 | Inaba et al. |
| 6,526,996 B1 | 3/2003 | Chang et al. |
| 6,534,807 B2 | 3/2003 | Mandelman et al. |
| 6,537,862 B2 | 3/2003 | Song |
| 6,537,885 B1 | 3/2003 | Kang et al. |
| 6,537,901 B2 | 3/2003 | Cha et al. |
| 6,541,829 B2 | 4/2003 | Nishinohara et al. |
| 6,555,879 B1 | 4/2003 | Krivokapic et al. |
| 6,562,665 B1 | 5/2003 | Yu |
| 6,562,687 B1 | 5/2003 | Deleonibus |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,610,576 B2 | 8/2003 | Nowak |

| | | | | | |
|---|---|---|---|---|---|
| 6,611,029 B1 | 8/2003 | Ahmed et al. | 6,921,691 B1 | 7/2005 | Li et al. |
| 6,630,388 B2 | 10/2003 | Sekigawa et al. | 6,921,702 B2 | 7/2005 | Ahn et al. |
| 6,635,909 B2 | 10/2003 | Clark et al. | 6,921,963 B2 | 7/2005 | Krivokapic et al. |
| 6,642,090 B1 | 11/2003 | Fried et al. | 6,921,982 B2 | 7/2005 | Joshi et al. |
| 6,642,114 B2 | 11/2003 | Nakamura | 6,924,190 B2 | 8/2005 | Dennison |
| 6,645,797 B1 | 11/2003 | Buynoski et al. | 6,960,517 B2 | 11/2005 | Rios et al. |
| 6,645,826 B2 | 11/2003 | Yamazaki et al. | 6,967,351 B2 | 11/2005 | Fried et al. |
| 6,645,861 B2 | 11/2003 | Cabral et al. | 6,974,738 B2 | 12/2005 | Hareland |
| 6,656,853 B2 | 12/2003 | Ito | 6,975,014 B1 | 12/2005 | Krivokapic et al. |
| 6,657,259 B2 | 12/2003 | Fried et al. | 6,977,415 B2 | 12/2005 | Matsuo |
| 6,660,598 B2 | 12/2003 | Hanafi et al. | 6,998,301 B1 | 2/2006 | Yu et al. |
| 6,664,160 B2 | 12/2003 | Park et al. | 6,998,318 B2 | 2/2006 | Park |
| 6,680,240 B1 | 1/2004 | Maszara | 7,018,551 B2 | 3/2006 | Beintner et al. |
| 6,686,231 B1 | 2/2004 | Ahmed et al. | 7,045,401 B2 | 5/2006 | Lee et al. |
| 6,689,650 B2 | 2/2004 | Gambino et al. | 7,045,407 B2 | 5/2006 | Keating et al. |
| 6,693,324 B2 | 2/2004 | Maegawa et al. | 7,045,441 B2 | 5/2006 | Chang et al. |
| 6,696,366 B1 | 2/2004 | Morey et al. | 7,056,794 B2 | 6/2006 | Ku et al. |
| 6,706,571 B1 | 3/2004 | Yu et al. | 7,060,539 B2 | 6/2006 | Chidambarrao et al. |
| 6,709,982 B1 | 3/2004 | Buynoski et al. | 7,061,055 B2 | 6/2006 | Sekigawa et al. |
| 6,713,396 B2 | 3/2004 | Anthony | 7,071,064 B2 | 7/2006 | Doyle et al. |
| 6,716,684 B1 | 4/2004 | Krivokapic et al. | 7,074,623 B2 | 7/2006 | Lochtefeld et al. |
| 6,716,686 B1 | 4/2004 | Buynoski et al. | 7,084,018 B1 | 8/2006 | Ahmed et al. |
| 6,716,690 B1 | 4/2004 | Wang et al. | 7,105,390 B2 | 9/2006 | Brask et al. |
| 6,730,964 B2 | 5/2004 | Horiuchi | 7,105,891 B2 | 9/2006 | Visokay |
| 6,744,103 B2 | 6/2004 | Snyder | 7,105,894 B2 | 9/2006 | Yeo et al. |
| 6,756,657 B1 | 6/2004 | Zhang et al. | 7,105,934 B2 | 9/2006 | Anderson et al. |
| 6,762,469 B2 | 7/2004 | Mocuta et al. | 7,112,478 B2 | 9/2006 | Grupp et al. |
| 6,764,884 B1 | 7/2004 | Yu et al. | 7,119,402 B2 | 10/2006 | Kinoshita et al. |
| 6,770,516 B2 | 8/2004 | Wu et al. | 7,122,463 B2 | 10/2006 | Ohuchi |
| 6,774,390 B2 | 8/2004 | Sugiyama et al. | 7,141,856 B2 | 11/2006 | Lee et al. |
| 6,784,071 B2 | 8/2004 | Chen et al. | 7,154,118 B2 | 12/2006 | Lindert |
| 6,784,076 B2 | 8/2004 | Gonzalez et al. | 7,163,851 B2 | 1/2007 | Abadeer et al. |
| 6,787,402 B1 | 9/2004 | Yu | 7,183,137 B2 | 2/2007 | Lee et al. |
| 6,787,439 B2 | 9/2004 | Ahmed et al. | 7,187,043 B2 | 3/2007 | Arai et al. |
| 6,787,845 B2 | 9/2004 | Deleonibus | 7,238,564 B2 | 7/2007 | Ko et al. |
| 6,787,854 B1 | 9/2004 | Yang et al. | 7,241,653 B2 | 7/2007 | Hareland et al. |
| 6,790,733 B1 | 9/2004 | Natzle et al. | 7,247,547 B2 | 7/2007 | Zhu et al. |
| 6,794,313 B1 | 9/2004 | Chang | 7,250,645 B1 | 7/2007 | Wang et al. |
| 6,794,718 B2 | 9/2004 | Nowak et al. | 7,291,886 B2 | 11/2007 | Doris et al. |
| 6,798,000 B2 | 9/2004 | Luyken et al. | 7,326,634 B2 | 2/2008 | Lindert et al. |
| 6,800,885 B1 | 10/2004 | An et al. | 7,348,284 B2 | 3/2008 | Doyle et al. |
| 6,800,910 B2 | 10/2004 | Lin et al. | 7,354,817 B2 | 4/2008 | Watanabe et al. |
| 6,803,631 B2 | 10/2004 | Dakshina-Murthy et al. | 7,358,121 B2 | 4/2008 | Chau et al. |
| 6,812,075 B2 | 11/2004 | Fried et al. | 7,396,730 B2 | 7/2008 | Li |
| 6,812,111 B2 | 11/2004 | Cheong et al. | 2001/0019886 A1 | 9/2001 | Bruce et al. |
| 6,815,277 B2 | 11/2004 | Fried et al. | 2001/0026985 A1 | 10/2001 | Kim et al. |
| 6,821,834 B2 | 11/2004 | Ando | 2001/0040907 A1 | 11/2001 | Chakrabarti |
| 6,825,506 B2 | 11/2004 | Chau et al. | 2002/0011612 A1 | 1/2002 | Hieda |
| 6,830,998 B1 | 12/2004 | Pan et al. | 2002/0036290 A1 | 3/2002 | Inaba et al. |
| 6,833,588 B2 | 12/2004 | Yu et al. | 2002/0037619 A1 | 3/2002 | Sugihara et al. |
| 6,835,614 B2 | 12/2004 | Hanafi et al. | 2002/0048918 A1 | 4/2002 | Grider et al. |
| 6,835,618 B1 | 12/2004 | Dakshina-Murthy et al. | 2002/0058374 A1 | 5/2002 | Kim et al. |
| 6,838,322 B2 | 1/2005 | Pham et al. | 2002/0074614 A1 | 6/2002 | Furuta et al. |
| 6,844,238 B2 | 1/2005 | Yeo et al. | 2002/0081794 A1 | 6/2002 | Ito |
| 6,849,556 B2 | 2/2005 | Takahashi | 2002/0096724 A1 | 7/2002 | Liang et al. |
| 6,849,884 B2 | 2/2005 | Clark et al. | 2002/0142529 A1 | 10/2002 | Matsuda et al. |
| 6,852,559 B2 | 2/2005 | Kwak et al. | 2002/0149031 A1 | 10/2002 | Kim et al. |
| 6,855,606 B2 | 2/2005 | Chen et al. | 2002/0160553 A1 | 10/2002 | Yamanaka et al. |
| 6,855,990 B2 | 2/2005 | Yeo et al. | 2002/0166838 A1 | 11/2002 | Nagarajan |
| 6,858,478 B2 | 2/2005 | Chau et al. | 2002/0167007 A1 | 11/2002 | Yamazaki et al. |
| 6,864,540 B1 | 3/2005 | Divakaruni et al. | 2002/0177263 A1 | 11/2002 | Hanafi et al. |
| 6,867,433 B2 | 3/2005 | Yeo et al. | 2002/0177282 A1 | 11/2002 | Song |
| 6,867,460 B1 | 3/2005 | Anderson et al. | 2003/0042542 A1 | 3/2003 | Maegawa et al. |
| 6,869,868 B2 | 3/2005 | Chiu et al. | 2003/0057477 A1 | 3/2003 | Hergenrother et al. |
| 6,869,898 B2 | 3/2005 | Inaki et al. | 2003/0057486 A1 | 3/2003 | Gambino et al. |
| 6,870,226 B2 | 3/2005 | Maeda et al. | 2003/0067017 A1 | 4/2003 | Ieong et al. |
| 6,884,154 B2 | 4/2005 | Mizushima et al. | 2003/0085194 A1 | 5/2003 | Hopkins, Jr. |
| 6,885,055 B2 | 4/2005 | Lee | 2003/0098479 A1 | 5/2003 | Murthy et al. |
| 6,891,234 B1 | 5/2005 | Connelly et al. | 2003/0098488 A1 | 5/2003 | O'Keeffe et al. |
| 6,897,527 B2 | 5/2005 | Dakshina-Murthy et al. | 2003/0102497 A1 | 6/2003 | Fried et al. |
| 6,902,962 B2 | 6/2005 | Yeo et al. | 2003/0102518 A1 | 6/2003 | Fried et al. |
| 6,909,151 B2 | 6/2005 | Hareland et al. | 2003/0111686 A1 | 6/2003 | Nowak |
| 6,919,238 B2 | 7/2005 | Bohr | 2003/0122186 A1 | 7/2003 | Sekigawa et al. |

| | | | | | | |
|---|---|---|---|---|---|---|
| 2003/0143791 A1 | 7/2003 | Cheong et al. | | 2005/0145894 A1 | 7/2005 | Chau et al. |
| 2003/0151077 A1 | 8/2003 | Mathew et al. | | 2005/0145941 A1 | 7/2005 | Bedell et al. |
| 2003/0174534 A1 | 9/2003 | Clark et al. | | 2005/0145944 A1 | 7/2005 | Murthy et al. |
| 2003/0190766 A1 | 10/2003 | Gonzalez et al. | | 2005/0148131 A1 | 7/2005 | Brask |
| 2003/0201458 A1 | 10/2003 | Clark et al. | | 2005/0148137 A1 | 7/2005 | Brask et al. |
| 2003/0227036 A1 | 12/2003 | Sugiyama et al. | | 2005/0153494 A1 | 7/2005 | Ku et al. |
| 2004/0016968 A1 | 1/2004 | Coronel et al. | | 2005/0156171 A1 | 7/2005 | Brask et al. |
| 2004/0029345 A1 | 2/2004 | Deleonibus et al. | | 2005/0156202 A1 | 7/2005 | Rhee et al. |
| 2004/0029393 A1 | 2/2004 | Ying et al. | | 2005/0156227 A1 | 7/2005 | Jeng |
| 2004/0031979 A1 | 2/2004 | Lochtefeld et al. | | 2005/0161739 A1 | 7/2005 | Anderson et al. |
| 2004/0033639 A1 | 2/2004 | Chinn et al. | | 2005/0167766 A1 | 8/2005 | Yagishita |
| 2004/0036118 A1 | 2/2004 | Abadeer et al. | | 2005/0170593 A1 | 8/2005 | Kang et al. |
| 2004/0036126 A1 | 2/2004 | Chau et al. | | 2005/0184316 A1 | 8/2005 | Kim |
| 2004/0036127 A1 | 2/2004 | Chau et al. | | 2005/0189583 A1 | 9/2005 | Kim et al. |
| 2004/0038436 A1 | 2/2004 | Mori et al. | | 2005/0199919 A1 | 9/2005 | Liu |
| 2004/0038533 A1 | 2/2004 | Liang | | 2005/0215014 A1 | 9/2005 | Ahn et al. |
| 2004/0061178 A1 | 4/2004 | Lin et al. | | 2005/0215022 A1 | 9/2005 | Adam et al. |
| 2004/0063286 A1 | 4/2004 | Kim et al. | | 2005/0224797 A1 | 10/2005 | Ko et al. |
| 2004/0070020 A1 | 4/2004 | Fujiwara et al. | | 2005/0224800 A1 | 10/2005 | Lindert et al. |
| 2004/0075149 A1 | 4/2004 | Fitzgerald et al. | | 2005/0227498 A1 | 10/2005 | Furukawa |
| 2004/0082125 A1 | 4/2004 | Hou et al. | | 2005/0230763 A1 | 10/2005 | Huang et al. |
| 2004/0092062 A1 | 5/2004 | Ahmed et al. | | 2005/0233156 A1 | 10/2005 | Senzaki |
| 2004/0092067 A1 | 5/2004 | Hanafi et al. | | 2005/0239252 A1 | 10/2005 | Ahn et al. |
| 2004/0094807 A1 | 5/2004 | Chau et al. | | 2005/0255642 A1 | 11/2005 | Liu et al. |
| 2004/0099903 A1 | 5/2004 | Yeo et al. | | 2005/0266645 A1 | 12/2005 | Park |
| 2004/0099966 A1 | 5/2004 | Chau et al. | | 2005/0272192 A1 | 12/2005 | Oh et al. |
| 2004/0108523 A1 | 6/2004 | Chen et al. | | 2005/0277294 A1 | 12/2005 | Schaeffer et al. |
| 2004/0108558 A1 | 6/2004 | Kwak et al. | | 2005/0280121 A1 | 12/2005 | Doris et al. |
| 2004/0110097 A1 | 6/2004 | Ahmed et al. | | 2006/0014338 A1 | 1/2006 | Doris et al. |
| 2004/0119100 A1 | 6/2004 | Nowak et al. | | 2006/0040054 A1 | 2/2006 | Pearlstein et al. |
| 2004/0124492 A1 | 7/2004 | Matsuo | | 2006/0046521 A1 | 3/2006 | Vaartstra et al. |
| 2004/0126975 A1 | 7/2004 | Ahmed et al. | | 2006/0063469 A1 | 3/2006 | Talieh et al. |
| 2004/0132236 A1 | 7/2004 | Doris | | 2006/0068591 A1 | 3/2006 | Radosavljevic et al. |
| 2004/0145000 A1 | 7/2004 | An et al. | | 2006/0071299 A1 | 4/2006 | Doyle et al. |
| 2004/0145019 A1 | 7/2004 | Dakshina-Murthy et al. | | 2006/0086977 A1 | 4/2006 | Shah et al. |
| 2004/0166642 A1 | 8/2004 | Chen et al. | | 2006/0154478 A1 | 7/2006 | Hsu et al. |
| 2004/0169221 A1 | 9/2004 | Ko et al. | | 2006/0172480 A1 | 8/2006 | Wang et al. |
| 2004/0169269 A1 | 9/2004 | Yeo et al. | | 2006/0202270 A1 | 9/2006 | Son et al. |
| 2004/0180491 A1 | 9/2004 | Arai et al. | | 2006/0211184 A1 | 9/2006 | Boyd et al. |
| 2004/0191980 A1 | 9/2004 | Rios et al. | | 2006/0227595 A1 | 10/2006 | Chuang et al. |
| 2004/0195624 A1 | 10/2004 | Liu et al. | | 2006/0240622 A1 | 10/2006 | Lee et al. |
| 2004/0198003 A1 | 10/2004 | Yeo et al. | | 2006/0263699 A1 | 11/2006 | Abatchev et al. |
| 2004/0203254 A1 | 10/2004 | Conley et al. | | 2006/0281325 A1 | 12/2006 | Chou et al. |
| 2004/0209463 A1 | 10/2004 | Kim et al. | | 2007/0001219 A1 | 1/2007 | Radosavljevic et al. |
| 2004/0217420 A1 | 11/2004 | Yeo et al. | | 2007/0023795 A1 | 2/2007 | Nagano et al. |
| 2004/0219722 A1 | 11/2004 | Pham et al. | | 2007/0045748 A1 | 3/2007 | Booth, Jr. et al. |
| 2004/0219780 A1 | 11/2004 | Ohuchi | | 2007/0048930 A1 | 3/2007 | Figura et al. |
| 2004/0222473 A1 | 11/2004 | Risaki | | 2007/0093010 A1 | 4/2007 | Mathew et al. |
| 2004/0227187 A1 | 11/2004 | Cheng et al. | | 2007/0108514 A1 | 5/2007 | Inoue et al. |
| 2004/0238887 A1 | 12/2004 | Nihey | | 2007/0241414 A1 | 10/2007 | Narihiro |
| 2004/0238915 A1 | 12/2004 | Chen et al. | | 2007/0262389 A1 | 11/2007 | Chau et al. |
| 2004/0256647 A1 | 12/2004 | Lee et al. | | | | |
| 2004/0262683 A1 | 12/2004 | Bohr et al. | | | FOREIGN PATENT DOCUMENTS | |
| 2004/0262699 A1 | 12/2004 | Rios et al. | | | | |
| 2005/0019993 A1 | 1/2005 | Lee et al. | | EP | 0623963 | 5/1994 |
| 2005/0020020 A1 | 1/2005 | Collaert et al. | | EP | 1091413 | 4/2001 |
| 2005/0035415 A1* | 2/2005 | Yeo et al. ............... 257/401 | | EP | 1202335 | 5/2002 |
| 2005/0040444 A1 | 2/2005 | Cohen | | EP | 1566844 | 8/2005 |
| 2005/0058374 A1 | 3/2005 | Gomyo et al. | | GB | 2156149 | 10/1985 |
| 2005/0059214 A1 | 3/2005 | Cheng et al. | | JP | 56073454 | 6/1981 |
| 2005/0073060 A1 | 4/2005 | Datta et al. | | JP | 59145538 | 8/1984 |
| 2005/0093028 A1 | 5/2005 | Chambers | | JP | 2303048 | 12/1990 |
| 2005/0093067 A1 | 5/2005 | Yeo et al. | | JP | 06005856 | 1/1994 |
| 2005/0093075 A1 | 5/2005 | Bentum et al. | | JP | 6151387 | 5/1994 |
| 2005/0093154 A1 | 5/2005 | Kottantharayil et al. | | JP | 06177089 | 6/1994 |
| 2005/0104055 A1 | 5/2005 | Kwak et al. | | JP | 06224440 | 8/1994 |
| 2005/0110082 A1 | 5/2005 | Cheng | | JP | 9162301 | 6/1997 |
| 2005/0118790 A1 | 6/2005 | Lee et al. | | JP | 20037842 | 2/2000 |
| 2005/0127362 A1 | 6/2005 | Zhang et al. | | JP | 2000037842 | 2/2000 |
| 2005/0127632 A1 | 6/2005 | Gehret | | JP | 2001338987 | 12/2001 |
| 2005/0133866 A1 | 6/2005 | Chau et al. | | JP | 2002298051 | 10/2002 |
| 2005/0136584 A1* | 6/2005 | Boyanov et al. ............ 438/199 | | JP | 2003-298051 | 10/2003 |
| 2005/0139860 A1 | 6/2005 | Snyder et al. | | JP | 2003298051 | 10/2003 |

| | | |
|---|---|---|
| TW | 516232 | 1/2003 |
| TW | 561530 | 1/2003 |
| TW | 548799 | 8/2003 |
| TW | 200402872 | 2/2004 |
| TW | 200405408 | 4/2004 |
| TW | 200417034 | 9/2004 |
| WO | WO0243151 | 5/2002 |
| WO | WO02095814 | 11/2002 |
| WO | WO03003442 | 1/2003 |
| WO | WO2004059726 | 7/2004 |
| WO | WO2005036651 | 4/2005 |

OTHER PUBLICATIONS

Final Office Action from U.S. Appl. No. 11/080,765 mailed Nov. 13, 2007, 13 pgs.

"U.S. Appl. No. 10/227,068 Office Action", (Dec. 18, 2006), pp. 1-25.

"U.S. Appl. No. 10/703,316 Office Action", (Dec. 15, 2006), pp. 1-22.

"U.S. Appl. No. 11/158,661 Final Office Action", (Jan. 15, 2008), 25 pages.

"U.S. Appl. No. 11/234,014 Non-Final Office Action", filed Sep. 22, 2005, 8.

"International Preliminary Report On Patentability", PCT/US2005/010505, (Oct. 12, 2006), 1-16.

"International Search Report", PCT/US2003/26242, (Jan. 26, 2004), 1-8.

"International Search Report", PCT/US2003/39727, (Apr. 27, 2004), 1-6.

"International Search Report", PCT/US2003/40320, (Jun. 2, 2004), 1-6.

"International Search Report & Written Opinion", PCT/US2004/032442, (Jun. 16, 2005), 1-21.

"International Search Report & Written Opinion", PCT/US2006/024516, (Jan. 17, 2007), 1-18.

"International Search Report & Written Opinion", PCT/US2006/037634, (May 31, 2007), 1-21.

"International Search Report & Written Opinion", PCT/US2006/037643, (Jan. 24, 2007), 1-14.

"International Search Report & Written Opinion", PCT/US2005/000947, (May 3, 2005), 1-14.

"International Search Report & Written Opinion", PCT/US2006/025751, (Dec. 6, 2006), 1-14.

"International Search Report & Written Opinion", PCT/US2005/035380, (Feb. 13, 2006), 1-14.

"International Search Report & Written Opinion", PCT/US2005/033439, (Jan. 31, 2006), 1-7.

"International Search Report & Written Opinion", PCT/US2005/037169, (Feb. 23, 2006), 1-11.

"International Search Report & Written Opinion", PCT/US2006/000378, (May 24, 2006), 1-11.

"International Search Report and Written Opinion", PCT/US2005/010505, (Aug. 26, 2005), 1-24.

"International Search Report and Written Opinion", PCT/US2005/020339, (Oct. 4, 2005), 1-12.

"Invitation to Pay Additional Fees, International Application No.", PCT/US2004/032442, (Apr. 12, 2005), 1-5.

Auth, Christopher P., et al., "Vertical, Fully-Depleted, Surroundings Gate MOSFETS On sub-0.1 um Thick Silicon Pillars", *54th Annual Device Research Conference Digest*, (1996), pp. 108-109.

Buchanan, D. A., et al., "Fabrication of Midgap Metal Gates Compatible With Ultrathin Dielectrics", *Applied Physics Letters 73.12*, (Sep. 21, 1998), pp. 1676-1678.

Burenkov, A., et al., "Corner effect in Double and Triple Gate FinFETs", *European Solild-State Device Research 2003, 33rd Conference on. ESSDERC*, (Sep. 16, 2003), pp. 135-138.

Chang, S. T., et al., "3-D Simulation of Strained S/SiGe heterojunction FinFets", *Semiconductor Device Research Symposium, 2003 International* Dec. 10-12, 2003, Piscataway, NJ, USA, (Dec. 2003), p. 176-177.

Chang, L., et al., "CMOS Circuit Performance Enhancement by Surface Orientation Optimization", *IEEE Transactions on Electron Devices*, vol. 51, No. 10, (Oct. 2004), pp. 1621-1627.

Chau, Robert, "Advanced Metal Gate/High-K Dielectric Stacks for High-Performance CMOS Transistors", Components Research, Intel Corporation, (2004), 1-3.

Choi, Yang-Kyu, et al., "A Spacer Patterning Technology for Nanoscale CMOS", IEEE, (49)3, XP-001102694, (2002), 436-441.

Choi, Yang-Kyu, et al., "Sub-20nm CMOS FinFET Technologies", IEEE, IEDM 01-421 to 1-424, (2001), 1-4.

Claflin, B., et al., "Interface Studies of Tungsten Nitride And Titanium Nitride Composite Metal Gate Electrodes With Thin Dielectric Layers", *Journal of Vacuum Science and Technology A 16.3*, (May/Jun. 1998), pp. 1757-1761.

Fried, David M., et al., "High-Performance P-Type Independent-Gate FinFETs", IEEE 25(4):, (2004), 199-201.

Fried, David M., et al., "Improved Independent Gate N-Type FinFET Fabrication and Characterization", IEEE 24(9):, 1-3.

Guo, Jing, et al., "Performance Projections for Ballistic Carbon Nanotube Field-Effect Transistors", Applied Physics Letters 80(17):, (Apr. 29, 2002), 3192-3194.

Hisamoto, Digh, et al., "A Folded-channel MOSFET for Deep-sub-tenth Micron Era", IEEE, (1998), 15.7.1-15.7.3.

Hisamoto, Digh, "A Folded-Channel MOSFET for Deepsub-tenth Micron Era", *1998 IEEE International Electron Device Meeting Technical Digest*, (1998), pp. 1032-1034.

Hisamoto, Digh, "A Fully Depleted Lean-Channel Transistor (DELTA)-A Novel Vertical Ultrahin SOI MOSFET", *IEEE Electron Device Letters*, V. 11 (1), (1990), pp. 36-38.

Hisamoto, Digh, "FinFET-A Self-Aligned Double-Gate MOSFET Scalable to 20 nm", *IEEE Transactions on Electron Devices*, vol. 47, No. 12, (Dec. 2000), pp. 2320-2325.

Huang, Xuejue, et al., "Sub 50 nm FinFET: PMOS", *1999 IEEE International Electron Device Meeting Technical Digest*, (1999), pp. 67-70.

Huang, Xuejue, et al., "Sub 50-nm FinFET: PMOS", *1999 IEEE International Electron Device Meeting Technical Digest*, IEEE, (1999), pp. 3.4.1-3.4.4.

Hwang, Jeong-Mo, et al., "Novel Polysilicon/Tin Stacked-Gate Structure for Fully-Depleted SOI/CMOS", *International Electronic Devices Meeting Technical Digest*, (1992), pp. 345-348.

Ieong, et al., "Three Dimensional CMOS Devices and Integrated Circuits", IEEE CICC, San Jose, CA Sep. 21-24, 2003, 207-217.

Javey, Ali, et al., "Ballistic Carbon Nanotube Field-Effect Transistors", *Nature*, vol. 424, (Aug. 3, 2003), 654-657.

Javey, Ali, et al., "High-k Dielectrics for Advanced Carbon-Nanotube Transistors and Logic Gates", www.nature.com/naturematerials.com, (2002), 1-8.

Jin, B., "Mobility Enhancement in Compressively Strained Sige Surface Channel PMOS Transistors with HFO2/TIN Gate Stack", Components Research, Intel Corporation, 1-12.

Jones, E. C., et al., "Doping Challenges in Exploratory Devices for High Performance Logic", 14th Int'l Conference, Piscataway, NJ, Sep. 22-27, 2002, 1-6.

Kim, Sung M., et al., "A Novel Multi-channel Field Effect Transistor (McFET) on Bulk Si for High Performance Sub-80nm Application", IEEE, (2004), 1-4.

Kuo, Charles, et al., "A Capacitorless Double Gate DRAM Technology for Sub-100-nm Embedded and Stand-Alone Memory Applications", IEEE 50(12):, (2003), 2408-2416.

Kuo, Charles, et al., "A Capacitorless Double-Gate DRAM Cell Design for High Density Applications", IEEE, (2002), 843-846.

Ludwig, et al., "FinFET Technology for Future Microprocessors", 2003 IEEE Int'l. SOI Conference, New Port Beach, CA, Sep. 29-Oct. 2, (2003), 33-34.

Martel, Richard, et al., "Carbon Nanotube Field Effect Transistors for Logic Applications", IEEE, 7.5.1-7.5.4.

Mayer, T. M., et al., "Chemical Vapor Deposition of Flouroalkylsilane Monolayer Films for Adhesion Control in Microelectromechanical Systems", J. Vac. Sci. Technol. B. 18(5):, (2000), 2433-2440.

Nackaerts, et al., "A 0.314um2 6T-SRAM Cell build with Tall Triple-Gate Devices for 45nm node applications using 0.75NA 193nm lithography", *IDEM*, (2004), 269-272.

Nowak, E. J., et al., "A Functional FinFET-DGCMOS SRAM Cell", Int'l. Electron Devices Meeting, San Francisco, CA Dec. 8-11, 2002, 411-414.

Nowak, E. J., et al., "Scaling Beyond the 65 nm Node with FinFET-DGCMOS", IEEE CICC, San Jose, CA Sep. 21-24, 2003, 339-342.

Nowak, Edward J., et al., "Turning Silicon On Its Edge.", *IEEE Circuits & Devices Magazine* vol. 1, (Jan./Feb. 2004), 20-31.

Ohsawa, Takashi, et al., "Memory Design Using a One-Transistor Gain Cell on SOI", *IEEE 37(11):*, (2002), 1510-1522.

Park, Donggun, et al., "3-dimensional nano-CMOS Transistors to Overcome Scaling Limits", *IEEE 2004*, ISBN 0-7803-8511-X, (2004), 35-40.

Park, T., et al., "Fabrication of Body-Tied FinFETs (Omega MOSFETS) Using Bulk Si Wafers", *2003 Symposia on VLSI Technology Digest of Technical Papers*, (Jun. 2003), pp. 135-136.

Park, T., et al., "Fabrication of Body-Tied FinFETs (Omega MOSFETs) Using Bulk Si Wafers", 2003 Symposium on VLSI Technology Digest of Technical Papers, (2003), 1-2.

Park, Jong-Tae, et al., "Pi-Gate SOI MOSFET", *IEEE Electron Device Letters*, vol. 22, No. 8, (Aug. 2001), pp. 405-406.

Park, et al., "PMOS Body-Tied FinFET (Omega MOSFET) Characteristics", Device Research Conference, Piscataway, NJ, Jun. 23-25, IEEE, (Jun. 2003), pp. 33-34.

Park, Jae-Hyoun, et al., "Quantum-Wired MOSFET Photodetector Fabricated by Conventional Photolighography on SOI Substrate", *Nanotechnology, 4th IEEE Conference on* Munich, Germany, Aug. 16-19, 2004, Piscataway, NJ, XP010767302, (2004), pp. 425-427.

PCT, "International Preliminary Report on Patentability", PCT/US/2006/037634, mailed Apr. 10, 2008, 1-11.

Seevinck, Evert, et al., "Static-Noise Margin Analysis of MOS SRAM Cells", IEEE, Journal of Solid-State Circuits, (SC-22)5, (1987), 1-7.

Stadele, M., et al., "A Comprehensive Study of Corner Effects in Tri-gate Transistors", *IEEE 2004*, pp. 165-168.

Stolk, Peter A., et al., "Modeling Statistical Dopant Fluctuations in MOS Transistors", IEEE Transactions on Electron Devices, (45)9, (1998), 1960-1971.

Subramanian, V., "A Bulk-Si-Compatible Ultrathin-body SOI Technology for Sub-100m MOSFETS", *Proceeding of the 57th Annual Device Research Conference*, (1999), pp. 28-29.

Sugizaki, T., et al., "Novel Multi-bit SONOS Type Flash Memory Using a High-k Charge Trapping Layer", *VLSI Technology, 2003. Digest of Technical Papers. Symposium on* Jun. 10-12, 2003., (2003), pp. 27-28.

Tanaka, T., et al., "Scalability Study on a Capacitorless IT-DRAM: From Single-gate PD-SOI to Double-gate FinDRAM", IEEE, (2004), 1-4.

Tokoro, Kenji, et al., "Anisotropic Etching Properties of Silicon in KOH and TMAH Solutions", *International Symposium on Micromechatronics and Human Science, IEEE*, (1998), pp. 65-70.

Wolf, Stanley, et al., "Wet Etching Silicon", *Silicon Processing for the VLSI Era*, vol. 1: Process Technology, Lattice Press, Sunset Beach, CA, (Sep. 1986), 3 pages.

Xiong, W., et al., "Corner Effect in Multiple-Gate SOI MOSFETs", IEEE (2003), 111-113.

Xiong, Weize, et al., "Improvement of FinFET Electrical Characteristics by Hydrogen Annealing", 25(8):, (2004), 541-543.

Yang, Fu-Liang, et al., "5 nm-Gate Nanowire FinFET", IEEE, (2004), 196-197.

Taiwan IPO Search Report for Application No. 094136197, dated mailed Sep. 19, 2008, 1.

IPOS, "Examiner's Written Opinion", Singapore Patent Application No. 200604766-6, (Apr. 4, 2008), 1-5.

Wang, X., et al., "Band alignments in sidewall strained Si/ strained SiGe heterostructures", (May 28, 2002), 1-5.

Office Action for U.S. Appl. No. 10/816,311 mailed Apr. 18, 2005, whole document.

Office Action for U.S. Appl. No. 10/816,311 mailed Sep. 30, 2005, whole document.

Final Office Action for U.S. Appl. No. 10/816,311 mailed Mar. 10, 2006, whole document.

Notice of Allowance for U.S. Appl. No. 10/816,311 mailed Nov. 9, 2006, whole document.

Notice of Allowance for U.S. Appl. No. 11/088,035 mailed Aug. 29, 2007, whole document.

* cited by examiner

BULK NON-PLANAR TRANSISTOR HAVING STRAINED ENHANCED MOBILITY AND METHODS OF FABRICATION

CROSS REFERENCE TO RELATED APPLICATIONS

This application is a continuation of U.S. application Ser. No. 11/088,035 filed on Mar. 22, 2005, now U.S. Pat. No. 7,326,634 which is a division of U.S. application Ser. No. 10/816,311 filed on Mar. 31, 2004, now U.S. Pat. No. 7,154,118, the entire contents of which are hereby incorporated by reference herein.

BACKGROUND OF THE INVENTION

1. Field of the Invention

The present invention relates to the field of integrated circuit manufacturing and more particularly to the formation of a strain enhanced mobility bulk nonplanar transistor and its method of fabrication.

2. Discussion of Related Art

Modern integrated circuits, such as microprocessors, are made up of literally hundreds of millions of transistors coupled together. In order to improve the performance and power of integrated circuits, new transistor structures have been proposed. A nonplanar transistor, such as a tri-gate transistor, has been proposed to improve device performance. A tri-gate transistor 100 is illustrated in FIGS. 1A and 1B. FIG. 1A is an illustration of a overhead/side view of a tri-gate transistor 100 and FIG. 1B is an illustration of a cross-sectional view taken through the gate electrode of a tri-gate transistor 100. Tri-gate transistor 100 includes a silicon body 102 having a pair of laterally opposite sidewalls 103 and a top surface 104. Silicon body 102 is formed on an insulating substrate including an oxide layer 106 which in turn is formed on a monocrystalline silicon substrate 108. A gate dielectric 110 is formed on the top surface 104 and on the sidewalls 103 of silicon body 102. A gate electrode 120 is formed on the gate dielectric layer 110 and surrounds the silicon body 102. A pair of source/drain regions 130 are formed in the silicon body 102 along laterally opposite sidewalls of gate electrode 120. Transistor 130 can be said to be a tri-gate transistor because it essentially has three gates ($G_1$, $G_2$, $G_3$) which essentially form three transistors. Tri-gate transistor 100 has a first gate/transistor on one side 103 of silicon body 102, a second gate/transistor on a top surface 104 of silicon body 102 and a third gate/transistor on the second side 103 of silicon body 102. Each transistor provides current flow proportional to the sides of silicon body 102. The tri-gate transistor are attractive because they have large current per area which improves device performance.

DETAILED DESCRIPTION OF THE PRESENT INVENTION

Embodiments of the present invention are bulk nonplanar transistors having strained enhanced mobility and their methods of fabrication. In the following description, numerous specific details have been set forth in order to provide a thorough understanding of the present invention. In other instances, well known semiconductor processing and fabrication techniques have not been set forth in particular detail in order to not unnecessarily obscure the present invention.

Embodiments of the present invention are bulk nonplanar transistors having strained enhanced mobility and their methods of fabrication. Embodiments of the present invention include a semiconductor body which places a capping layer formed on or around the semiconductor body under strain. A capping layer under strain increases the mobility of carriers in the device which increases the current of the device which can be used to improve circuit speeds.

Figure 1B:
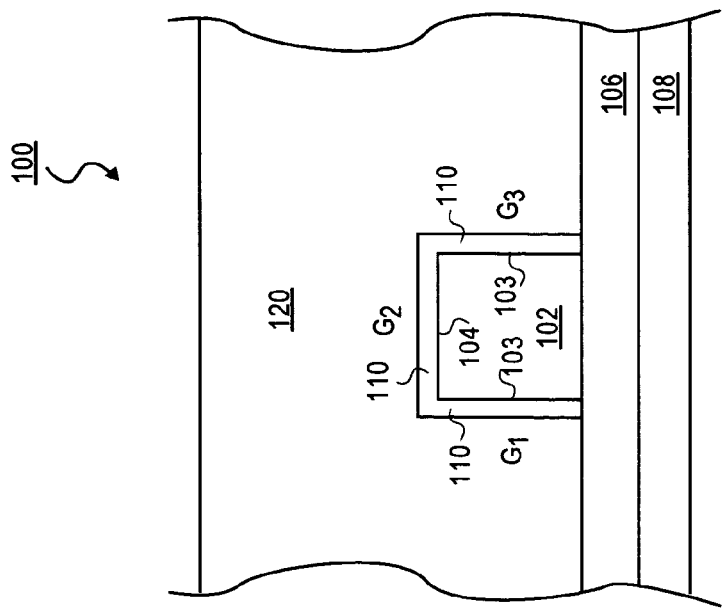
FIG. 1B shows a cross-sectional view of standard tri-gate transistor.
Figure 1A:
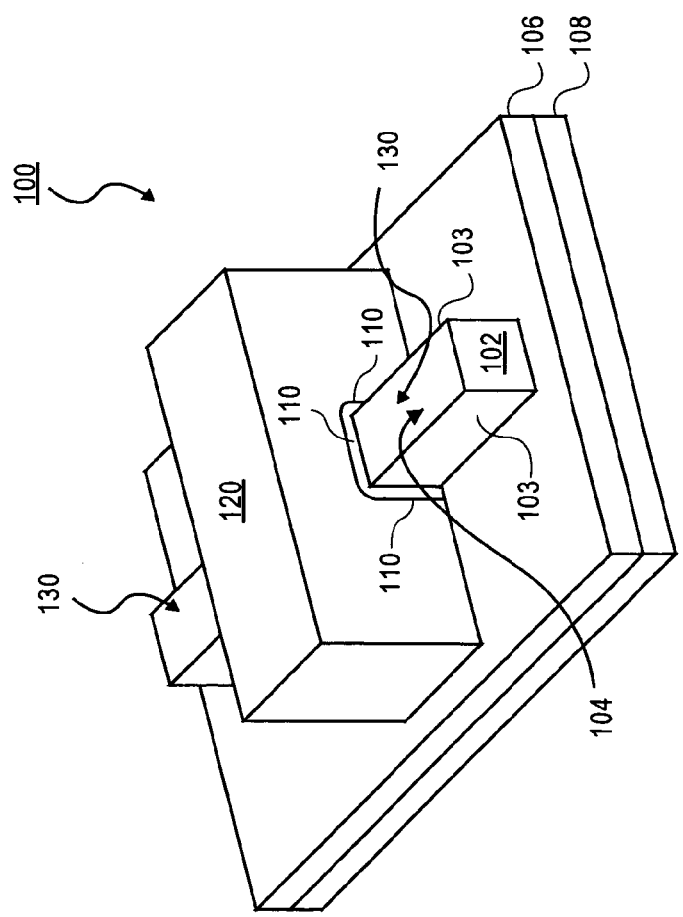
FIG. 1A shows an overhead view of a standard tri-gate transistor.
Figure 2:
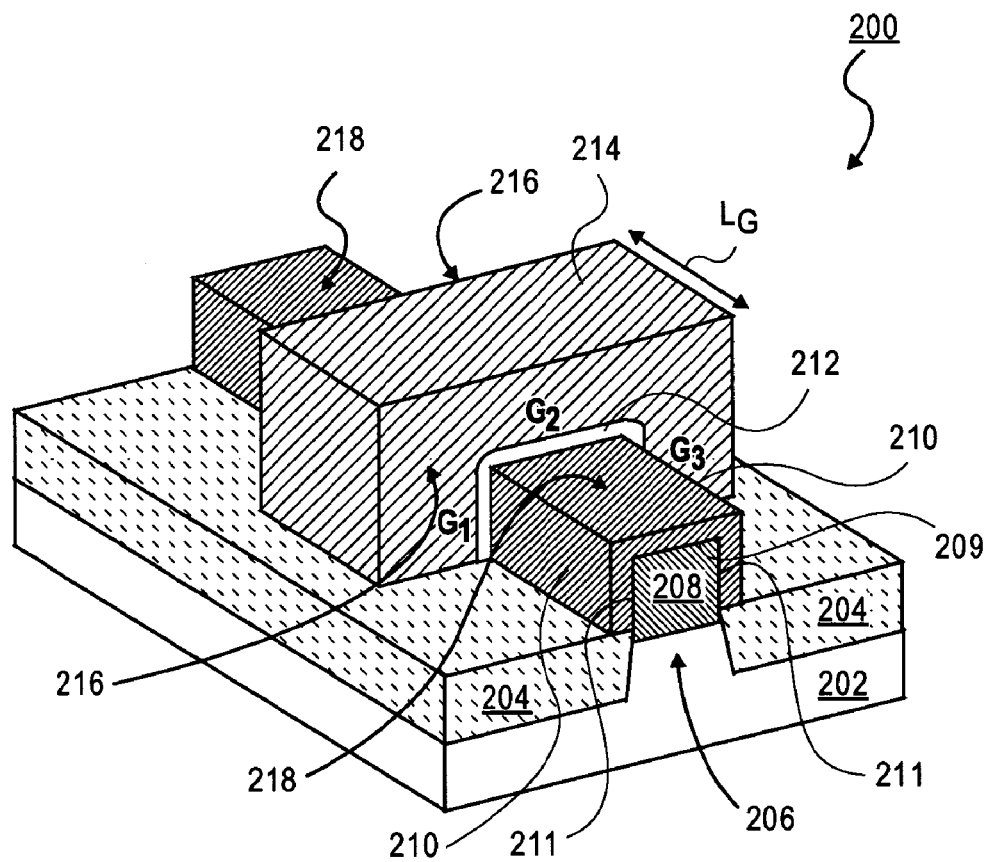
FIG. 2 is an illustration of a bulk tri-gate transistor having a strain induced mobility in accordance with an embodiment with the present invention.

An example of a bulk nonplanar or tri-gate transistor 200 having strain enhanced mobility is illustrated in FIG. 2. Transistor 200 is formed on a bulk semiconductor substrate 202. In an embodiment of the present invention, the substrate 202 is a monocrystalline silicon substrate. Formed in semiconductor substrate 202 are a pair of spaced apart isolation regions 204, such as shallow trench isolation (STI) regions, which define the substrate active region 206 therebetween. Substrate 202, however, need not necessarily be a silicon monocrystalline substrate and can be other types of substrates, such as but not limited to germanium (Ge), silicon germanium ($Si_xGe_y$), gallium arsenide (GaAs), InSb, GaP, and GaSb. The active region 206 is typically doped to a p type conductivity level between $1\times10^{16}$ to $1\times10^{19}$ atoms/cm$^3$ for an n type device and doped to an n type conductivity level between $1\times10^{16}$ to $1\times10^{19}$ atoms/cm$^3$ for a p type device. In other embodiments of the present invention, the active region 206 can be an undoped semiconductor, such as an intrinsic or undoped silicon monocrystalline substrate.

Transistor 200 has a semiconductor body 208 formed on active substrate region 206 of bulk substrate 202. The semiconductor body 208 has a top surface 209 and a pair of laterally opposite sidewalls 211. The top surface 209 is separated from the bottom surface formed on semiconductor substrate 206 by a distance which defines the body height. The laterally opposite sidewalls 211 of the semiconductor body 208 are separated by a distance which defines the body width. The semiconductor body 208 is a monocrystalline or single crystalline semiconductor film. In an embodiment of the present invention, the semiconductor body 208 is formed from a semiconductor material different than the semiconductor used to form the bulk substrate 202. In an embodiment of the present invention, the semiconductor body 208 is formed from a single crystalline semiconductor having a different lattice constant or size than the bulk semiconductor substrate 202 so that the semiconductor body 208 is placed under strain. In an embodiment of the present invention, the bulk semiconductor substrate is a monocrystalline silicon substrate and the semiconductor body 208 is a single crystalline silicon-germanium alloy. In an embodiment of the present invention, the silicon germanium alloy comprises between 5-40% germanium and ideally approximately between 15-25% germanium.

In an embodiment of the present invention, the bulk semiconductor substrate 202 is a monocrystalline silicon substrate and the semiconductor body 208 is a silicon-carbon alloy.

In an embodiment of the present invention, semiconductor body 208 is formed to a thickness less than the amount at which the exterior surfaces of the semiconductor body 208 will cause relaxation in the crystal lattice. In an embodiment of the present invention, semiconductor body 208 is formed to a thickness between 100-2000 Å and more particularly between 200-1000 Å. In an embodiment of the present invention, the thickness and height of the semiconductor body 208 are approximately the same.

In an embodiment of the present invention, the width of the semiconductor body 208 is between half the body 208 height to two times the body 208 height. In an embodiment of the present invention, semiconductor body 208 is doped to a p type conductivity with a concentration between $1\times10^{16}$ to $1\times10^{19}$ atoms/cm$^3$ for an n type semiconductor device and is doped to an n type conductivity with a concentration between $1\times10^{16}$ to $1\times10^{19}$ atoms/cm$^3$ for a p type semiconductor device. In an embodiment of the present invention, the semiconductor body 208 is intrinsic semiconductor, such as an undoped or intrinsic silicon film.

Transistor 200 includes a semiconductor capping layer 210 formed on the sidewalls 211 of semiconductor body 208 as well as on the top surface 209 of semiconductor body 208. Semiconductor capping layer 210 is a single crystalline semiconductor film. In an embodiment of the present invention, the semiconductor capping layer 210 is formed of a semiconductor material having a different lattice constant than the semiconductor body 208 so that a strain is formed in the capping layer. In an embodiment of the present invention, the capping layer has a tensile strain. A tensile strain is thought to improve the mobility of electrons. In an embodiment of the present invention, the capping layer has a compressive strain. A compressive strain is thought to improve hole mobility. In an embodiment of the present invention, current flows in a direction perpendicular to the strain in capping layer 210. In an embodiment of the present invention, the strain in the capping layer 210 on the sidewalls 211 of semiconductor body 208 is greater than the strain in the capping layer 210 on the top surface 209 of semiconductor body 208.

In an embodiment of the present invention, the semiconductor capping layer 210 is a single crystalline silicon film. In an embodiment of the present invention, the capping layer 210 is a single crystalline silicon film formed on a silicon-germanium alloy body 208. A single crystalline silicon film formed on a silicon-germanium alloy semiconductor body 208 will cause the single crystalline silicon film to have a tensile stress. In an embodiment of the present invention, the capping layer 210 is a single crystalline silicon film formed on a silicon-carbon alloy semiconductor body 208. A single crystalline silicon capping layer 210 formed on a silicon-carbon alloy semiconductor body 208 will cause the single crystalline silicon film 210 to have a compressive stress.

In an embodiment of the present invention, the semiconductor capping layer 210 is formed to a thickness less than the amount at which the lattice of the single crystalline film will relax. In an embodiment of the present, the semiconductor capping layer 210 is formed to a thickness between 50-300 Å. In an embodiment of the present invention, the thickness of the capping layer on the sidewalls 211 of semiconductor body 208 is the same as the thickness of the capping layer 210 on the top surface 209 of semiconductor body 208 as illustrated in FIG. 2. In an embodiment of the present invention, the semiconductor capping layer 210 is formed thicker on the top surface of the semiconductor body 208 than on the sidewalls 211, such as shown, for example, in FIG. 4C.

Transistor 200 includes a gate dielectric layer 212. Gate dielectric layer 212 is formed on capping layer 210 formed on the sidewalls 211 of semiconductor body 208 and is formed on semiconductor capping layer 210 formed on the top surface 209 of semiconductor body 208. Gate dielectric layer 210 can be any well known gate dielectric layer. In an embodiment of the present invention, the gate dielectric layer is a silicon dioxide (SiO$_2$), silicon oxynitride (SiO$_x$N$_y$), or a silicon nitride (Si$_3$N$_4$) dielectric layer. In an embodiment of the present invention, the gate dielectric layer 212 is a silicon oxynitride film formed to a thickness between 5-20 Å. In an embodiment of the present invention, the gate dielectric layer 212 is a high K gate dielectric layer, such as a metal oxide dielectric, such as but not limited to tantalum pentaoxide (Ta$_2$O$_5$), titanium oxide (TiO$_2$), hafnium oxide (HfO) and zirconium oxide (ZrO). Gate dielectric layer 212, however, can be other types of high K dielectrics, such as but not limited to PZT and BST.

Transistor 200 includes a gate electrode 214. Gate electrode 214 is formed on and around the gate dielectric layer 212 as shown in FIG. 2. Gate electrode 214 is formed on and adjacent to gate dielectric layer 212 formed on capping layer 210 formed on sidewall 211 of semiconductor body 208 and is formed on gate dielectric layer 212 formed on capping layer 210 formed on the top surface 209 of semiconductor body 208 and is formed on or adjacent to gate dielectric layer 212 formed on capping layer 210 formed on sidewall 211 of gate electrode 208 as shown in FIG. 2. Gate electrode 214 has a pair of laterally opposite sidewalls 216 separated by a distance which defines the gate length (Lg) of transistor 200. In an embodiment of the present invention, the laterally opposite sidewalls 216 of gate electrode 214 run in a direction perpendicular to the laterally opposite sidewalls 211 of semiconductor body 208. Gate electrode 214 can be formed of any suitable gate electrode material. In an embodiment of the present invention, gate electrode 214 comprises polycrystalline silicon film doped to a concentration density between $1\times10^{19}$ to $1\times10^{20}$ atoms/cm$^3$. Gate electrode 214 can be doped to an n type conductivity for an n type device and p type conductivity for a p type device. In an embodiment of the present invention, the gate electrode can be a metal gate electrode. In an embodiment of the present invention, the gate electrode 214 is formed of a metal film having a work function which is tailored for an n type device, such as a work function between 3.9 eV to 4.2 eV. In an embodiment of the present invention, the gate electrode 214 is formed from a metal film having a work function tailored for a p type device, such as a work function between 4.9 eV to 5.2 eV. In an embodiment of the present invention, the gate electrode 214 is formed from a material having midgap work function between 4.6 to 4.8 eV. A midgap work function is ideal for use when semiconductor body 208 and capping layer 210 are intrinsic semiconductor films. It is to be appreciated that gate electrode 214 need not necessarily be a single material and can be composite stack of thin films, such as but not limited to polycrystalline silicon/ metal electrode or metal polycrystalline silicon electrode.

Transistor 200 has a pair source/drain regions formed in semiconductor body 208 as well as in capping layer on opposite sides of a laterally opposite sidewalls 216 of gate electrode 214 as shown in FIG. 2. The source/drain regions 218 are doped to an n type conductivity when forming an n type device and doped to a p type conductivity when forming a p type device. In an embodiment of the present invention, the source/drain regions have doping concentration of between $1\times10^{19}$ to $1\times10^{21}$ atoms/cm$^3$. The source/drain regions 218 can be formed of uniform concentration or can include subregions of different concentrations or doping profiles, such as tip regions (e.g., source/drain extensions). In an embodiment of the present invention, when transistor 200 is a symmetrical transistor the source and drain regions will have the same doping concentration profile. In an embodiment of the present invention, transistor 200 is an asymmetrical transistor, the source region and drain region may vary in order to obtain particular electrical characteristics.

The portion of the semiconductor body 208 and capping layer 210 located between the source/drain regions 216 and beneath the gate electrode 214 defines a channel region of the transistor. The channel region can also be defined as the area of semiconductor body 208 and capping layer 210 surrounded by gate electrode 214. The source/drain regions typically extend slightly beneath the gate electrode through, for example, diffusion to define the channel region slightly smaller than the gate electrode length (Lg). When transistor 300 is turned "ON" an inversion layer is formed in the channel region of the device which forms a conductive channel which enables current to travel between the source/drain region 340. The inversion layer or conductive channel forms in the surface of the capping layer on the sidewalls 211 of semiconductor body 208 as well as in the surface of capping layer 210 on the top surface 209 of semiconductor body 208.

By providing a gate dielectric layer 212 and a gate electrode 214 which surrounds the semiconductor body 208 and capping layer 210 on three sides, the nonplanar transistor is characterized as having three channels and three gates, one gate (G1) which extends between the source/drain regions on one side 211 of semiconductor body 208, a second gate (G2) which extends between the source/drain regions on the top surface 209 of semiconductor body 208 and the third (G3) which extends between the source/drain regions on sidewall 211 of semiconductor body 208. The gate "width" (Gw) of transistor 200 is the sum of the width of the three channel regions. That is, the gate width of transistor 200 is equal to the height of semiconductor body 208 plus the thickness of the capping layer on the top surface of sidewall 211, plus the width of semiconductor body 208 plus the thickness of the capping layer on each of the sides 211 of semiconductor body plus the height of semiconductor body 208 plus the thickness of capping layer 210 on the top surface 209 of semiconductor body 208. Larger "width" transistor can be obtained by using multiple semiconductor bodies 208 and capping layers surrounded by a single gate electrode, such as illustrated in FIG. 3I.

Although a tri-gate transistor 200 is illustrated in FIG. 2, the present invention is equally applicable to other nonplanar transistors. For example, the present invention is applicable to a "finfet" or a double gate transistor or just two gates are formed on opposite sides of the semiconductor body. Additionally, the present invention, is applicable to "omega" gates or wrap around gate devices where the gate electrode wraps around the semiconductor body as well as underneath a portion of the semiconductor body. Performance of "finfet" devices and "omega" devices can be improved by including a strained capping layer 210 formed on a semiconductor body 208 and thereby enhancing the mobility of carriers in the device. It is to be appreciated that a nonplanar device is a device which when turned "ON" forms a conductive channel or a portion of the conductive channel in a direction perpendicular to the plane of the substrate 202. A nonplanar transistor can also be said to be a device where the conductive channel regions are formed both in the horizontal and vertical directions.

Figure 3A:
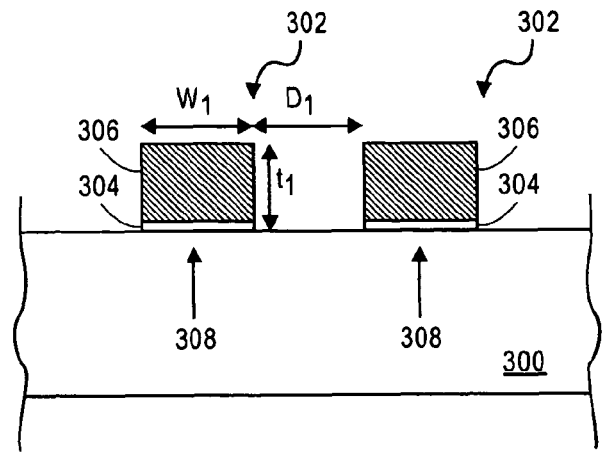
FIGS. 3A-3I illustrate a method of forming a bulk tri-gate transistor having a strain enhanced mobility in accordance with an embodiment of the present invention.
Figure 3B:
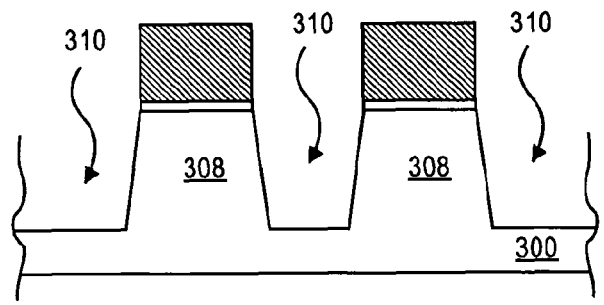
Figure 3C:
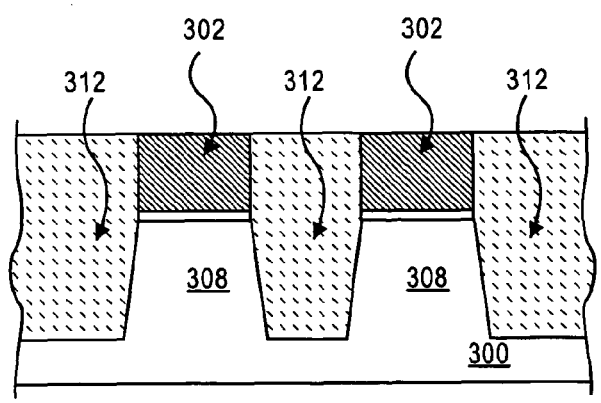
Figure 3D:
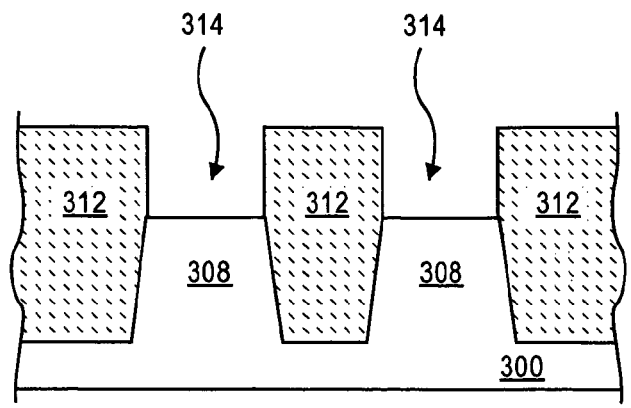
Figure 3E:
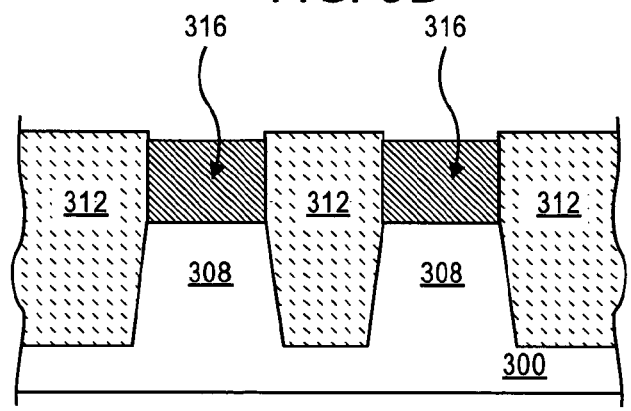
Figure 3F:
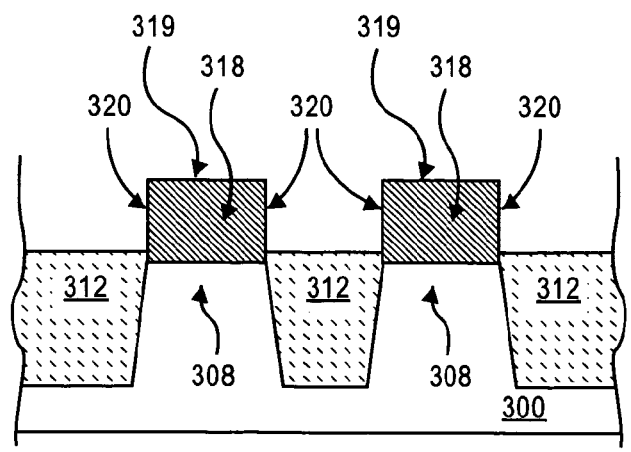
Figure 3G:
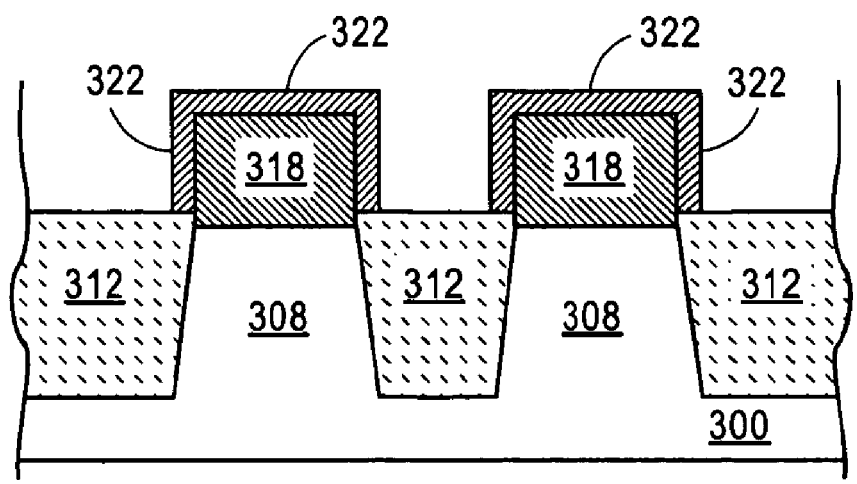
Figure 3H:
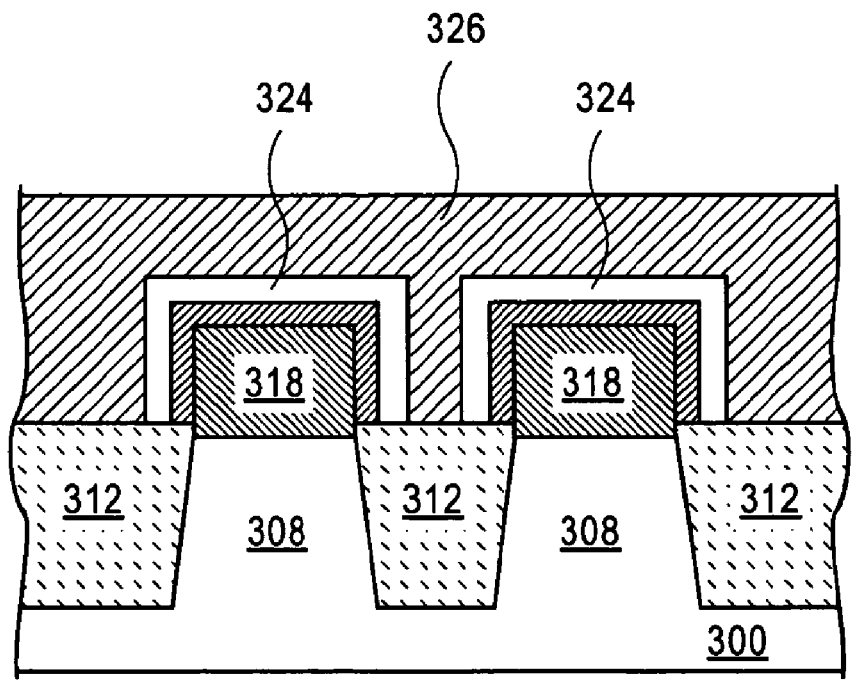
Figure 3I:
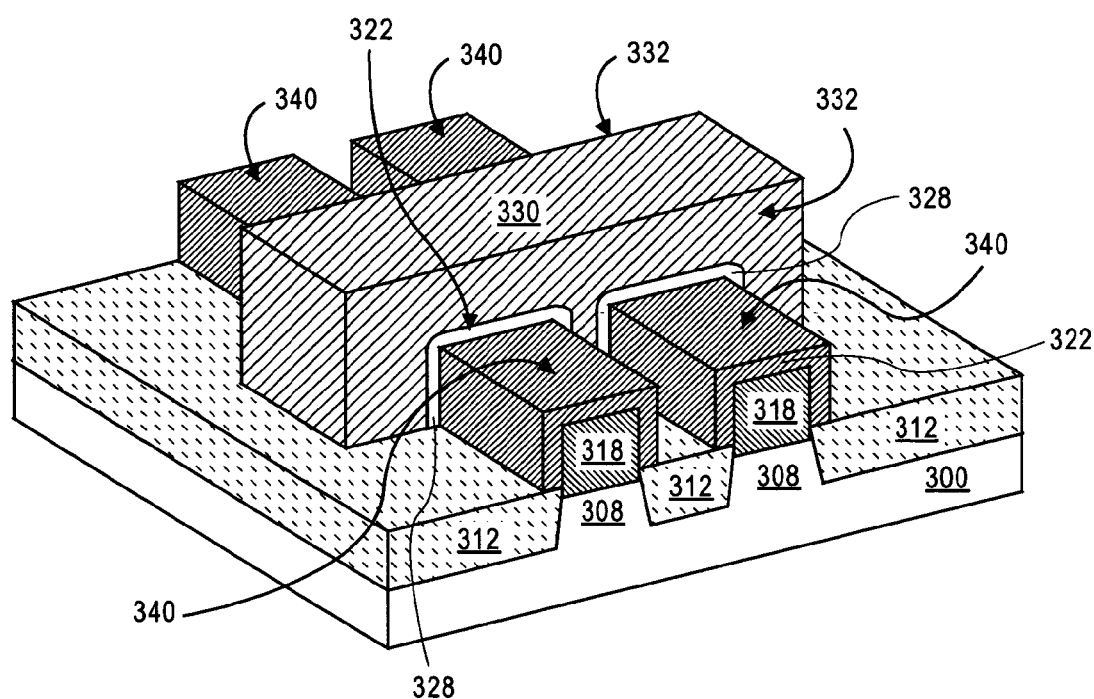

FIGS. 3A-3I illustrate a method of forming a bulk nonplanar transistor having a strain enhanced mobility in accordance with an embodiment of the present invention. First a semiconductor substrate 300 is provided as shown in FIG. 3A. In an embodiment of the present invention, semiconductor substrate 300 is a monocrystalline silicon substrate. Substrate 300 need not necessarily be a silicon substrate and can be other types of substrates, such as a silicon germanium substrate, a germanium substrate, a silicon germanium alloy, a gallium arsenide, InSb, and GaP. In an embodiment of the present invention, the semiconductor substrate 300 is an intrinsic (i.e., undoped) silicon substrate. In other embodiments of the present invention, the semiconductor substrate 300 is doped to a p type or n type conductivity with a concentration between $1\times10^{16}$ to $1\times10^{19}$ atom/cm$^3$. Next, a mask having mask portions 302 for forming isolation regions is formed on substrate 300 as shown in FIG. 3A. In an embodiment of the present invention, the mask is an oxidation resistant mask. In an embodiment of the present invention, the mask portions 302 comprise a thin pad oxide layer 304 and a thicker silicon nitride or oxidation resistant layer 306. The mask portions 302 define active regions 308 in substrate 300 where transistor bodies are to be formed. The mask portions 302 can be formed by blanket depositing a pad oxide layer and then a silicon nitride layer over substrate 300. Next, well known photolithography techniques are used to mask, expose and develop a photoresist masking layer over locations where mask portions 302 are to be formed. The nitride film 306 and the pad oxide layers 304 are then etched in alignment with the formed photoresist mask to form mask portions 302 as shown in FIG. 3A.

In an embodiment of the present invention, mask portions 302 have a width (W1) which is the minimum width or minimum feature dimension (i.e., critical dimension (CD)) which can be defined utilizing photolithography in the fabrication of the transistor. Additionally, in an embodiment of the present invention, mask portions 302 are separated by a distance D1 which is the minimum distance which can be defined utilizing photolithography in the fabrication process. That is, mask portions 302 have the smallest dimension and are spaced apart by the smallest dimension (i.e., critical dimensions) which can be reliably and achieved utilizing the photolithography process used to fabricate the transistor. In this way, mask portions 302 are defined to have the smallest size and greatest density capable of being achieved with the photolithography process used in fabrication of the transistor.

In an embodiment of the present invention, mask portions 302 have a thickness (T1) which is equal to or greater than the thickness or height desired for the subsequently formed semiconductor body or bodies.

Next, as shown in FIG. 3B, the exposed portions of semiconductor 300 are etched in alignment with the outside edges of mask portion 302 to form trench openings 310. The trench openings are etched to a depth sufficient to isolate adjacent transistors from one another.

Next, as shown in FIG. 3C, the trenches are filled with a dielectric layer 312 to form shallow trench isolation (STI) regions 312 in substrate 300. In an embodiment of the present invention, the dielectric layer is formed by first growing a thin liner oxide in the bottom of sidewalls of trench 310. Next, trench 312 is filled by blanket depositing an oxide dielectric layer over the liner oxide by, for example, a high density plasma (HDP) chemical vapor deposition process. The fill dielectric layer will also form on the top of mask portions 302.

The fill dielectric layer can then be removed from the top of mask portions 302 by, for example, chemical mechanical polishing. The chemical mechanical polishing process is continued until the top surface of mask portions 302 is revealed and the top surface of shallow trench isolation regions 312 substantially planar with the top surface of mask portion 302 as shown in FIG. 3C.

Although shallow trench isolation regions are ideally used in the present invention, other well known isolation regions and techniques, such as local oxidation of silicon (LOCOS) or recessed LOCOS may be utilized.

Next, as shown in FIG. 3D, mask portions 302 are removed from substrate 300 to form semiconductor body openings 314. First a silicon nitride portion 306 is removed utilizing an etchant which etches away the oxidation resistant or silicon nitride portion 306 without significantly etching the isolation regions 312. After removing silicon nitride portion 306, the pad oxide portion 304 is removed. Pad oxide portion 304 can be removed, for example, with a wet etchant comprising hydrofluoric acid (HF). Removing of mask portions 302 forms a semiconductor body opening or trench 314 having substantially vertical sidewalls. The vertical sidewall enables the semiconductor body to be grown within the trench and confined therein to enable a semiconductor body to be formed with nearly vertical sidewalls.

Next, as shown in FIG. 3E, a semiconductor body film 316 is formed in opening 314 as shown in FIG. 3E. In an embodiment of the present invention, the semiconductor body film 316 is an epitaxial semiconductor film. In an embodiment of the present invention, when a strain enhanced semiconductor device is desired, the semiconductor film is formed from a single crystalline semiconductor film having a different lattice constant or different lattice size than the underlying semiconductor substrate upon which it is grown, so that the semiconductor film is under strain. In an embodiment of the present invention, the single crystalline silicon film 316 has a larger lattice constant or lattice size than the underlying semiconductor substrate 300. In an embodiment of the present invention, the single crystalline semiconductor film 316 has a smaller lattice size or constant than the underlying semiconductor substrate 300.

In an embodiment of the present invention, the semiconductor film 316 is an epitaxial silicon germanium alloy film selectively grown on a silicon monocrystalline substrate 300. A silicon germanium alloy can be selectively grown in an epitaxial reactor utilizing a deposition gas comprising, dichlorosilane (DCS), $H_2$, germane ($GeH_4$), and HCl. In an embodiment of the present invention, the silicon germanium alloy comprises between 5-40% germanium and ideally between 15-25% germanium. In an embodiment of the present invention, epitaxial semiconductor film 316 is a single crystalline silicon carbon alloy formed on a silicon substrate 300. The single crystalline semiconductor film 316 is deposited to a thickness desired for the thickness of the semiconductor body. In an embodiment of the present invention, it is grown or deposited to a thickness less than the height of the top surface of isolation regions 312. In this way, the isolation regions 312 confines the semiconductor film 316 within the trench so that a semiconductor film with nearly vertical sidewalls is formed. Alternatively, semiconductor film 316 can be blanket deposited over substrate 300 including within trench 314 and on top of isolation regions 312 and then polished back so that the semiconductor film 316 is removed from the top of the isolation regions and remains only within trenches 314 as shown in FIG. 3E.

In an embodiment of the present invention, the semiconductor film 316 is an undoped or intrinsic semiconductor film. In an embodiment of the present invention, when fabricating a p type device, the semiconductor film 316 doped to an n type conductivity with a concentration between $1 \times 10^{16}$ to $1 \times 10^{19}$ atoms/cm$^3$. In an embodiment of the present invention, when fabricating an n type device the semiconductor film 316 is doped to a p type conductivity with a concentration between $1 \times 10^{16}$ to $1 \times 10^{19}$ atoms/cm$^3$. The semiconductor film 316 can be doped during deposition in an "insitu" process by including a dopant gas in the deposition process gas mix. Alternatively, the semiconductor film 316 can be subsequently doped by, for example, ion implantation or thermal diffusion to form a doped semiconductor film 316.

Next, isolation regions 312 are etched back or recessed to expose the sidewalls 320 of semiconductor film 316 and thereby form semiconductor bodies 318 as shown in FIG. 3F. Semiconductor bodies 318 have nearly vertical sidewalls 320 because semiconductor film 316 was laterally confined by isolation regions 312 during deposition. Isolation regions 312 are etched back with an etchant which does not significantly etch the semiconductor film 316. When semiconductor film 316 is a silicon or silicon alloy isolation regions 312 can be recessed utilizing a wet etchant comprising HF. In an embodiment of the present invention, isolation regions are etched back to a level so that they are substantially planar with the top surface of the active regions 308 formed in semiconductor substrate 300 as shown in FIG. 3F.

Next, as shown in FIG. 3G, a semiconductor capping layer 322 is formed on the top surface 319 and sidewalls 320 of semiconductor body 318. Semiconductor capping layer 322 is a single crystalline semiconductor film. In an embodiment of the present invention, the semiconductor capping layer 322 is formed of a material having a different lattice constant or size than semiconductor body 318. In an embodiment of the present invention, semiconductor capping layer 322 is a single crystalline silicon film. In an embodiment of the present invention, semiconductor capping layer 322 is a single crystalline silicon film formed on a silicon germanium alloy body 318. In an embodiment of the present invention, semiconductor capping layer 322 is a single crystalline silicon film formed on a silicon-carbon alloy semiconductor body 318. A single crystalline silicon capping layer 322 can be selectively deposited in an epitaxial deposition reactor utilizing a process gas comprising DCS, HCl and $H_2$. In an embodiment of the present invention, semiconductor capping layer 322 is formed to a thickness less than an amount which will cause substantial relaxation in semiconductor capping layer 322. In an embodiment of the present invention, semiconductor capping layer 322 is formed to a thickness sufficient to enable the entire inversion layer to be formed in the capping layer when the transistor is turn "ON". In an embodiment of the present invention, semiconductor capping layer 322 is formed to a thickness between 50-300 Å. In an embodiment of the present invention, semiconductor capping layer 322 is an undoped or intrinsic semiconductor film. In an embodiment of the present invention, semiconductor capping layer 322 is doped to an n type conductivity between $1 \times 10^{16}$ to $1 \times 10^{19}$ atoms/cm$^3$ when forming a p type device and is doped to a p type conductivity between $1 \times 10^{16}$ to $1 \times 10^{19}$ atoms/cm$^3$ when forming an n type device. In an embodiment of the present invention, semiconductor capping layer 322 is doped in an insitu deposition process. Alternatively, capping layer 322 can be doped by other well known techniques, such as by ion implantation or solid source diffusion.

Next, as shown in FIG. 3H, a gate dielectric film 324 is formed on capping layer 322 formed on the sidewalls 320 of semiconductor body 318 and is formed on the capping layer 322 formed on the top surface 319 of semiconductor body 318 as shown in FIG. 3H. In an embodiment of the present invention, gate dielectric layer 324 is a grown gate dielectric layer, such as but not limited to a silicon dioxide layer, a silicon oxynitride layer or a combination thereof. A silicon oxide or silicon oxynitride layer can be grown on semiconductor capping layer utilizing a well known dry/wet oxidation process. When gate dielectric layer 324 is grown it will form only on semiconductor containing areas, such as capping layer 322 and not on isolation regions 312. Alternatively, gate dielectric layer 324 can be a deposited dielectric layer. In an embodiment of the present invention, gate dielectric layer 324 is a high K gate dielectric layer, such as a metal oxide dielectric layer, such as but not limited to hafnium oxide, zirconium oxide, tantalum oxide and titanium oxide. A high K metal oxide dielectric layer can be deposited by any well known technique, such as chemical vapor deposition or sputter deposition. When gate dielectric layer 324 is deposited it will also form on isolation regions 312.

Next, as shown in FIG. 3H, a gate electrode material 326 is blanket deposited over substrate 300 so that it deposits onto and around gate dielectric layer 324. That is, the gate electrode material is deposited onto the gate dielectric layer 324 formed on capping layer 322 formed on the top surface of semiconductor body 318 and is formed or adjacent to capping layer 322 formed on the sidewalls 320 of semiconductor body 318. In an embodiment of the present invention, the gate electrode material 326 is polycrystalline silicon. In an embodiment of the present invention, the gate electrode material 326 is a metal film. In an embodiment of the present invention, gate electrode material 326 is a metal film having a work function tailored for an n type device and in an embodiment of the present invention, the gate electrode material is metal film having a work function tailored for a p type device. Gate electrode material 326 is formed to a thickness sufficient to completely cover or surround semiconductor bodies 318, capping layer 322 and gate dielectric layer 324 as shown in FIG. 3H.

Next, as shown in FIG. 3I, the gate electrode material 326 and gate dielectric layer 324 are patterned by well known techniques to form a gate electrode 330 and a gate dielectric layer 328. Gate electrode material 326 and gate dielectric layer 324 can be patterned utilizing well known photolithography and etching techniques. Gate electrode 330 has a pair of laterally opposite sidewalls 332 which define the gate length of the device. In an embodiment of the present invention, laterally opposite sidewalls 332 run in a direction perpendicular to semiconductor bodies 318. Although, a subtractive process is shown for the formation of gate electrode 330, other well known techniques, such as a replacement gate process may be utilized to form gate electrode 330.

Next, as also shown in FIG. 3I, a pair of source/drain regions 340 are formed in capping layer 332 and semiconductor body 318 on opposite sides of gate electrode 330. When forming an n type device, source/drain regions can be formed to an n type conductivity with a concentration between $1\times10^{20}$ to $1\times10^{21}$ atoms/cm$^3$. In an embodiment of the present invention, when forming a p type device, source/drain regions having a p type conductivity with a concentration between $1\times10^{20}$ to $1\times10^{21}$ atoms/cm$^3$ can be formed. Any well known technique, such as ion implantation or thermal diffusion, may be utilized to form the source/drain regions. When ion implantation is used, the gate electrode 330 can be used to mask the channel region of the transistor from the ion implantation process and thereby self-aligning the source/drain regions 340 with the gate electrode 330. Additionally, if desired, source/drain regions may include sub-regions, such as source/drain extensions and source/drain contact regions.

Well known processes including formation of spacers can be utilized to form the sub-regions. Additionally, if desired, silicide can be formed on the source/drain regions 340 and on top of the gate electrode 330 to further decrease the electrical contact resistance. This completes the fabrication of bulk nonplanar transistor having strain enhanced mobility.

Well known "back end" techniques can be utilized to form metal contacts, metallization layers and interlayer dielectrics to interconnect various transistors together into functional integrated circuits, such as microprocessors.

A valuable aspect of the present invention, is that the capping layer increases the gate width of the transistor. In this way, minimum feature dimension and spacing can be used to form the semiconductor bodies and then the capping layer can be formed on and around the minimally defined semiconductor bodies to increase the gate width of the device. This increases the current per area of the device which improves device performance. Formation of a capping layer on minimally defined and separated features reduces the distance between minimally spaced bodies to a distance less than the critical dimension or less than the dimension achievable with photolithography process used to define the device. In this way, the formation of a capping layer enables larger gate width to be achieved with each semiconductor body while still defining the bodies with the minimum critical dimensions (CD) and spacing. Utilizing a capping layer to increase the gate width is valuable even in applications which do not require or desire stress enhanced mobility. As such, embodiments of the present invention include applications where, for example, silicon capping layers are formed on minimally spaced silicon bodies in order to increase the gate width of the fabricated transistor. Additionally, use of a capping layer to increase gate width per area is useful in non-bulk devices, such as tri-gate or nonplanar devices formed on insulated substrates, such as in silicon on insulator (SOI) substrates.

Figure 5:
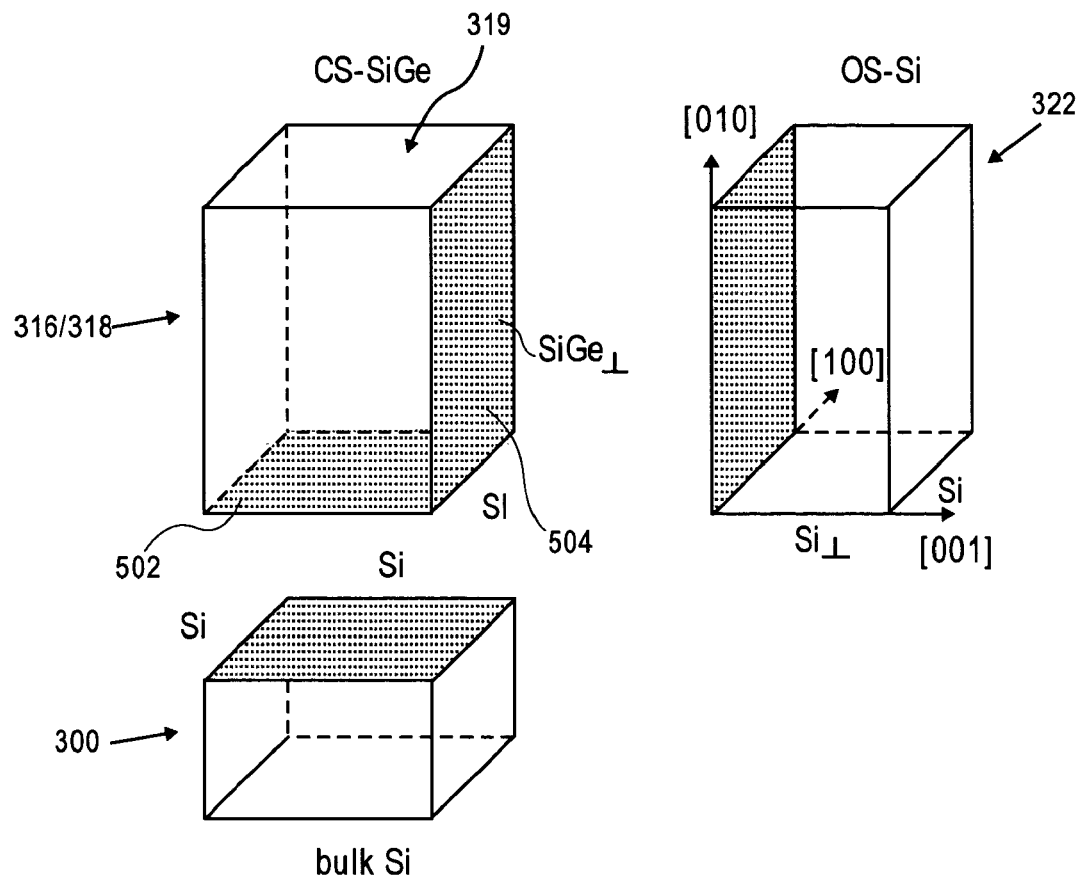
FIG. 5 illustrates crystal lattices for a bulk silicon, a strained silicon germanium semiconductor body and a stained silicon capping layer.

In embodiments of the present invention, stacks of semiconductor films (i.e., bulk semiconductor 300, semiconductor body 318 and capping layer 322) are engineered to produce high strain in the capping layer 322 which can dramatically increase carrier mobility. FIG. 5 illustrates how a bulk silicon monocrystalline silicon substrate, a silicon germanium alloy semiconductor body 320 and a silicon capping layer 322 can produce high tensile stress in the silicon capping layer 322. When growing an epitaxial silicon germanium alloy film 316 on a monocrystalline substrate 300 (FIG. 3E) the lattice constant of the plane 502 of the silicon germanium film 318 parallel to the surface of the silicon monocrystalline substrate 300 is matched to the silicon lattice of the bulk silicon substrate 300. The lattice constant of the plane 504 of the silicon germanium alloy 316 perpendicular to the silicon substrate surface is larger than the plane 502 parallel to the silicon substrate 300 due to the tetragonal distortion of the silicon germanium epitaxial film 316. Once the isolation regions 312 are recessed (FIG. 3F) to form silicon germanium body 318 the silicon germanium lattice on the top 319 will expand and the lattice constant on the sides will contract due to the presence of free surface. In general the lattice constant on the sidewall 320 of the silicon germanium alloy 318 will be larger than the lattice constant on the top surface 319 of the silicon germanium alloy which will be greater than the lattice constant of the silicon germanium alloy on the silicon monocrystalline substrate. When a silicon capping layer 322 is grown on the strained silicon germanium alloy, (FIG. 3G) the silicon germanium alloy 318 will impose its lengthened vertical cell dimension 504 on an already smaller cell dimension of the silicon capping layer 322 producing a orthorhombic strained silicon capping layer 322 on the sidewalls of the SiGe body 318. Thus, the silicon capping layer formed on the sidewalls 322 of the silicon germanium alloy will witness a substantial tensile strain and a lower but significant tensile strain on the top surface 319 of the silicon germanium alloy. The strain produced in silicon capping layer 322 is in a direction perpendicular to current flow in the device.

Figure 4A:
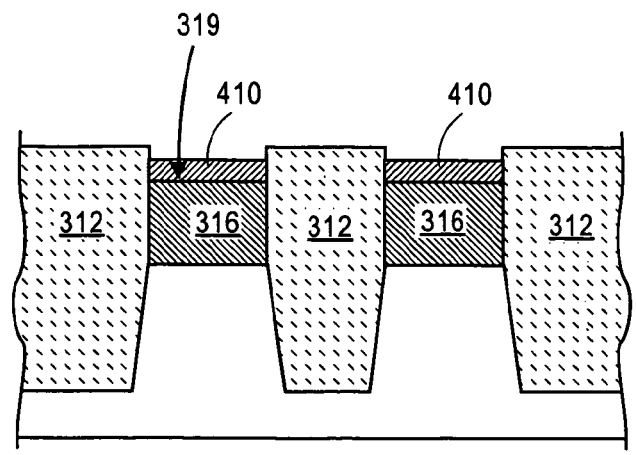
FIGS. 4A-4C illustrate a method of forming a bulk tri-gate transistor having a strain enhanced mobility in accordance with an embodiment of the present invention.
Figure 4B:
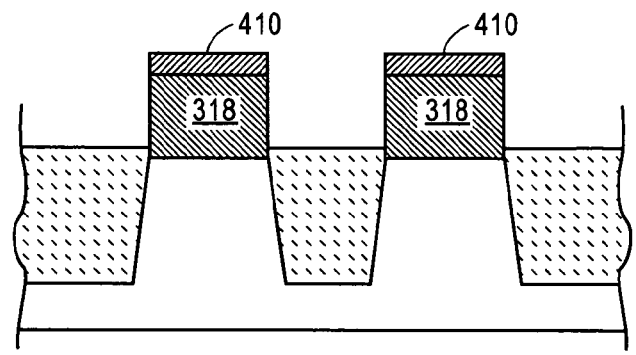
Figure 4C:
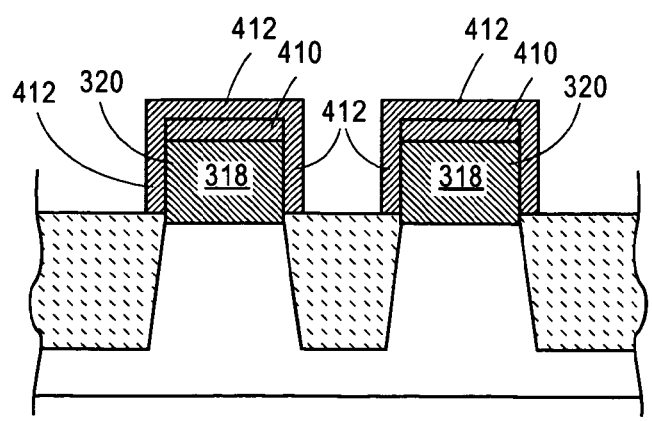

FIGS. 4A-4C illustrate a method of forming a bulk nonplanar transistor having strain enhanced mobility wherein the capping layer is formed thicker on the top surface of the semiconductor body than on the sidewalls. As illustrated in FIG. 4A, semiconductor body film 316 is grown between isolation regions 312 as described with respect to FIG. 3E. In this embodiment, however, a first portion 410 of the capping layer is grown on semiconductor body 316 prior to recessing isolation regions 312. In an embodiment of the present invention, silicon nitride layer 306 is formed thicker than necessary for the semiconductor body 318 so that additional room is provided to enable the first portion 410 of the semiconductor capping layer to be grown within the trench 310. In this way, the first portion of the capping layer 410 can be confined within the isolation regions 312. After formation of the first portion 410 of the capping layer, the isolation regions 312 are recessed back as described above to form a semiconductor body 318 having a capping layer 410 formed on the top surface thereof as shown in FIG. 4B. Next, as shown in FIG. 4C, a second portion 412 of the capping layer is grown on the sidewalls 320 of the semiconductor body 318 and on the first portion 410 of the capping layer formed on the top surface 319 of semiconductor body 320. In an embodiment of the present invention, the semiconductor capping layer 410 is formed to a thickness substantially equal to the thickness of the second portion of the capping layer 412. In this way, when a substantially square semiconductor body 318 is formed, the semiconductor body 318 plus capping layer will still provide a substantially square capped body. Next, processing can continue as illustrated in FIGS. 3H and 3I to complete fabrication of the bulk nonplanar transistor having a strain enhanced mobility.

We claim:

1. A semiconductor device comprising:
   a strained semiconductor body forming a heterojunction with a substrate semiconductor material, wherein said substrate semiconductor material is a first single crystal comprising a first group IV element, said first single crystal having a first lattice constant, and wherein said strained semiconductor body is a second single crystal comprising a second group IV element, said strained semiconductor body having a top surface and laterally opposite sidewalls;
   a semiconductor capping layer on the top surface and on the sidewalls of said strained semiconductor body, wherein said semiconductor capping layer is a third single crystal comprising said first group IV element;
   a gate dielectric layer on said semiconductor capping layer on said top surface and on said sidewalls of said strained semiconductor body;
   a gate electrode having a pair of laterally opposite sidewalls on said gate dielectric layer; and
   a pair of source/drain regions in said strained semiconductor body on opposite sides of said gate electrode, wherein the second single crystal at the heterojunction disposed below the gate dielectric layer is tetragonally distorted to have a second and third lattice constant, the second lattice constant along a plane parallel to the heterojunction and matched with the first lattice constant, the third lattice constant along a plane orthogonal to the heterojunction and mismatched with the first lattice constant.

2. The semiconductor device of claim 1, wherein said semiconductor capping layer has a tensile strain.

3. The semiconductor device of claim 2, wherein said semiconductor capping layer has greater tensile stress on the sidewalls of said strained semiconductor body than on the top surface of said strained semiconductor body.

4. The semiconductor device of claim 2, wherein said source/drain regions are n type conductivity.

5. The semiconductor device of claim 1, wherein said semiconductor substrate comprises a silicon substrate, wherein said strained semiconductor body comprises a silicon germanium alloy and wherein said semiconductor capping layer comprises a silicon film.

6. The semiconductor device of claim 1, wherein said semiconductor capping layer has a compressive strain.

7. The semiconductor device of claim 6, wherein said strained semiconductor body has tetragonal distortion and said semiconductor capping layer has a greater compressive strain on the sidewalls than on the top surface of said strained semiconductor body.

8. The semiconductor device of claim 6, wherein said semiconductor substrate comprises a monocrystalline silicon substrate, wherein said strained semiconductor body comprises a silicon-carbon alloy and wherein said semiconductor capping layer comprises a single crystalline epitaxial silicon film.

9. The semiconductor device of claim 1, wherein said semiconductor substrate comprises a silicon substrate, wherein said strained semiconductor body comprises a silicon germanium epitaxial body, and wherein said semiconductor capping layer comprises a single crystalline epitaxial silicon capping layer.

10. The semiconductor device of claim 1, wherein a width of the semiconductor body is greater than a height of the semiconductor body.

11. The semiconductor device of claim 1, wherein the semiconductor device comprises a tri-gate transistor.

12. The semiconductor device of claim 1, wherein the semiconductor body comprises carbon.

13. The semiconductor device of claim 1, wherein the semiconductor capping layer is orthorhombicly strained by the third lattice constant.

* * * * *